United States Patent [19]
Potter et al.

[11] Patent Number: 5,582,393
[45] Date of Patent: Dec. 10, 1996

[54] METHOD TO MAINTAIN THE LEVELNESS OF A HEATED CRUCIBLE

[75] Inventors: L. John Potter, Ontario; John A. Appoloney, Rochester; Barry A. Lees, Fairport; Frederick L. Kuhn, Macedon; Lloyd A. Relyea; John Wozniak, Jr., both of Webster, all of N.Y.

[73] Assignee: Xerox Corporation, Stamford, Conn.

[21] Appl. No.: 426,506

[22] Filed: Apr. 21, 1995

[51] Int. Cl.$^6$ ....................................................... C21B 3/00
[52] U.S. Cl. ................................................ 266/44; 266/275
[58] Field of Search ................................... 432/251, 253, 432/262, 263; 266/78, 275, 283, 44; 118/726, 720

[56] References Cited

U.S. PATENT DOCUMENTS

| | | | |
|---|---|---|---|
| 2,773,923 | 12/1956 | Smith | 432/262 |
| 3,746,502 | 7/1973 | Erhart et al. | 432/263 |
| 3,748,090 | 7/1973 | Ciuffini et al. | 432/263 |
| 4,676,193 | 6/1987 | Martin | 118/720 |
| 4,700,660 | 10/1987 | Levchenko et al. | 118/726 |
| 4,854,264 | 8/1989 | Noma et al. | 118/719 |

*Primary Examiner*—Scott Kastler
*Attorney, Agent, or Firm*—Zosan S. Soong

[57] ABSTRACT

There is disclosed a method for maintaining the levelness of a crucible having a first end and a second end during thermal expansion of the crucible comprising: providing a continuous pulling force on the first end in a direction parallel to the length of the crucible during heating of the crucible.

6 Claims, 2 Drawing Sheets

5,582,393

METHOD TO MAINTAIN THE LEVELNESS OF A HEATED CRUCIBLE

This invention relates to a method and apparatus for maintaining the levelness of a crucible during thermal expansion of the crucible.

Crucible arrays are commonly used within the vacuum chambers in the fabrication of for example alloy photoreceptors. The crucible arrays may consist of two or more crucible strings which are resistively heated. The crucibles are a continuous length of material typically 304 stainless steel where several recessed cavities are stamped into each crucible. These cavities are commonly referred to as boats and many combinations of crucible and boat dimensions exist. Some crucibles are even chrome plated to prevent the interaction of the photoreceptor alloys and the crucible material. Crucibles have been used effectively in evaporation deposition systems for a number of years, but there has always been a problem of compensating for the thermal expansion of the crucible material at the temperatures such as 700 degrees F. in which the deposition systems operate. Crucibles may have a length of up to 115 inches and have been observed to grow in length of about 0.5 inch to about 1.0 inch when heated. During heating, the crucibles if fixed rigid at either or both ends would expand in a bowing (up or down) and/or twisting (side to side) manner causing molten alloy pools to vary in depth which in turn causes the phenomenon known as fractionation (the separation of selenium and tellurium elements present in the photogenerator material as well as the separation of the arsenic and selenium in the transport materials used) and in some cases incomplete evaporation may occur, resulting in unacceptable product from an electrical standpoint. The bowing and/or twisting of the crucible can also lead to coating defects due to alloy spattering. The bowing of the heated crucible changes the height or levelness of a portion of the crucible.

Previous designs have been implemented to deal with the crucible expansion problem. These prior take-up systems work well for compensating for the length increase of the crucible. However, these prior art systems all have the tendency to change the height or levelness of the crucible at the place where the crucible is fastened to the prior art take-up systems. Moreover, the prior art systems are plagued with seizing failures due to interference in movement from the coating up of the systems with several layers of for example selenium.

FIG. 1 represents a prior art take-up system 2 where the lip 4 of a crucible 6 pushes against an end plate 8 coupled to a spring 10. However, as the crucible expands, the system of FIG. 1 exerts a downward directing force on the crucible end which may undesirably change the level of the crucible and cause the problems described above. In addition, the system of FIG. 1 is susceptible to seizing failures due to interference in movement from the coating up of the system.

The present invention minimizes or eliminates one or more of the above noted disadvantages associated with conventional take-up systems.

Conventional evaporation crucibles and vacuum evaporating apparatus are disclosed in Erhart et al., U.S. Pat. 3,746,502, Levchenko et al., U.S. Pat. 4,700,660, and Noma et al., U.S. Pat. 4,854,264, the disclosures of which are totally incorporated by reference.

SUMMARY OF THE INVENTION

The present invention involves providing a method for maintaining the levelness of a crucible having a first end and a second end during thermal expansion of the crucible comprising: providing a continuous pulling force on the first end in a direction parallel to the length of the crucible during heating of the crucible.

There is also provided in embodiments of the present invention a method for maintaining the levelness of a crucible having a first end and a second end during thermal expansion of the crucible comprising: securing the second end to minimize movement of the crucible; and providing a continuous pulling force on the entire first end in a direction parallel to the length of the crucible during heating of the crucible.

BRIEF DESCRIPTION OF THE DRAWINGS

Other aspects of the present invention will become apparent as the following description proceeds and upon reference to the Figures.

Unless otherwise noted, the same reference numeral in the Figures refers to the same or similar feature.

DETAILED DESCRIPTION

Figure 1:
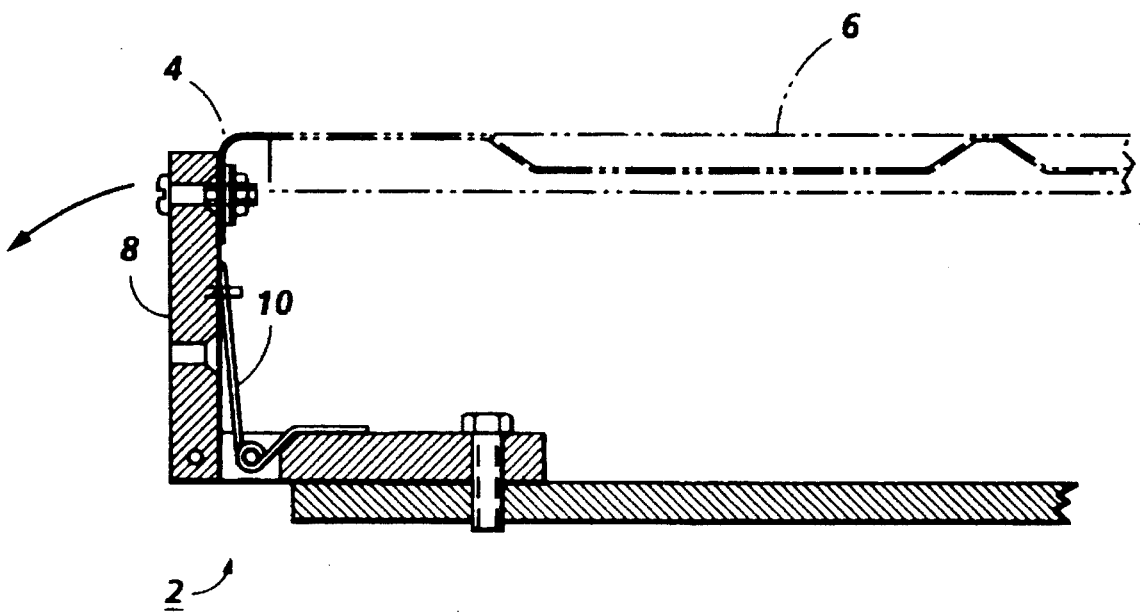
FIG. 1 is a schematic, cross-section view of a prior art take-up system.
Figure 2:
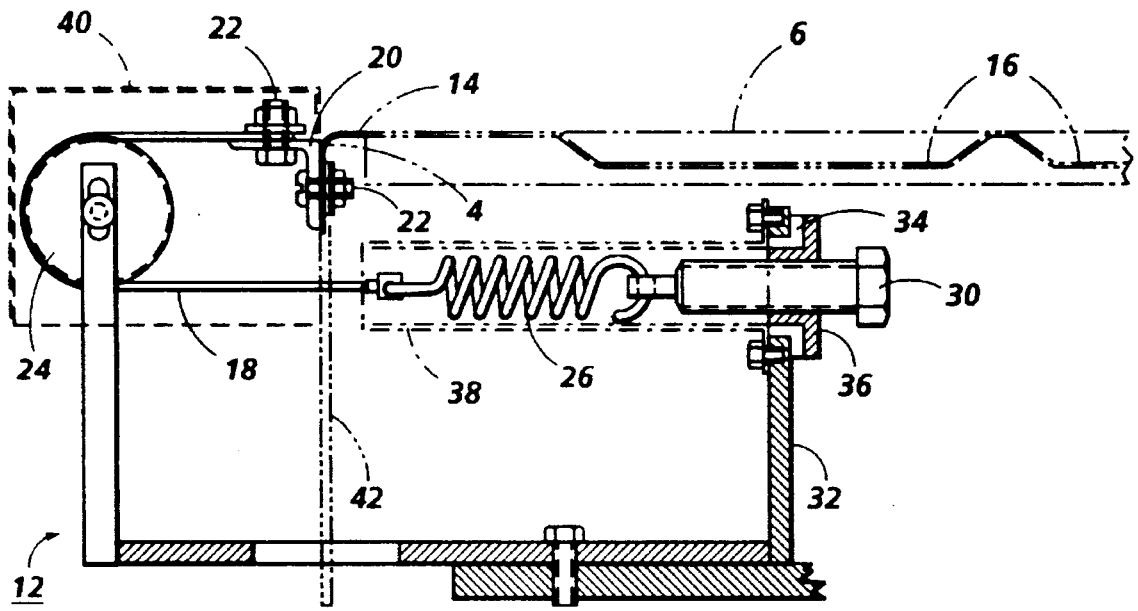
FIG. 2 is a cross-sectional view of a preferred embodiment of the inventive apparatus.
Figure 3:
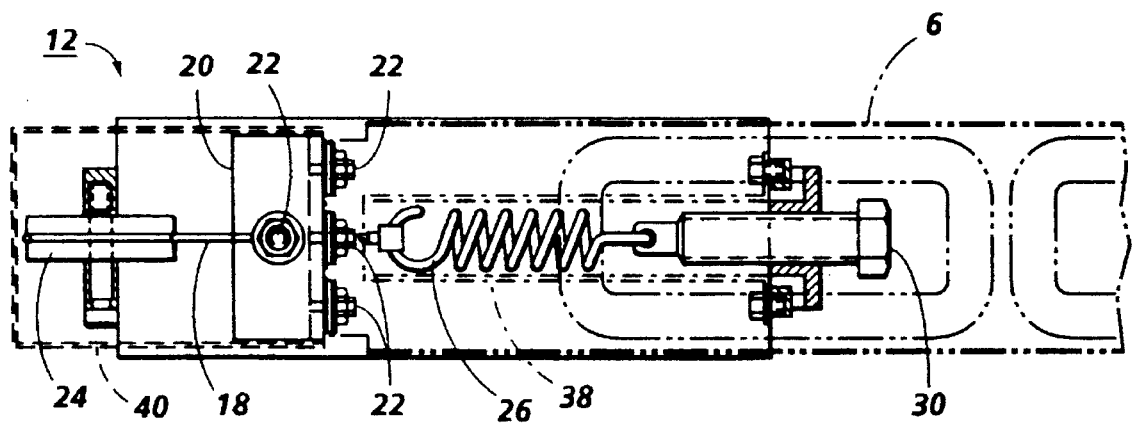
FIG. 3 is a top view of the embodiment of FIG. 2.

FIGS. 2 and 3 represent a preferred apparatus 12 to maintain the levelness of a crucible 6 during thermal expansion of the crucible. The crucible has a first end 14 and a second end (not shown) and is depicted with multiple cavities 16. The first end 14 of the crucible is coupled at lip 4 of the crucible to a cable 18, preferably fabricated from stainless steel, via an angle bracket 20 and bolts 22. The angle bracket, which preferably is coated with a nonconductive ceramic material, extends along a substantial portion of the width of the first end 14 and permits the cable to exert a pulling force along a section of the first end, preferably along the entire first end, of the crucible. To facilitate positioning of a part of the apparatus below the crucible, due to space constraints, the cable 18 wraps around an adjustable idler pulley 24, which may be fabricated from a ceramic material. The other end of the cable is coupled via for example a crimp connection to an extension spring 26. A tensioning device 30, for example a bolt, is coupled to the spring 26 to adjust the tension of the cable. The spring 26 functions to minimize any changes to the cable tension upon expansion or contraction of the crucible length. The tensioning device 30 is mounted onto the support frame 32 via a bushing 34 and a threaded adjustment bushing 36. A dust enclosure tube 38 covers the spring 26 and a portion of the tensioning device 30. A protective cover 40, fabricated from for example stainless steel, protects the cable, angle bracket, and pulley from being coated, thereby minimizing or eliminating take-up failures due to movement interference. A power connection 42 to the crucible is also illustrated. The second end of the crucible (not shown) is secured for example to an angle bracket attached to a base plate to minimize movement of the crucible.

An alternate embodiment of the inventive apparatus is where the spring and tensioning device are approximately level with the crucible instead of underneath it. In this alternate embodiment, there is no need to employ the pulley.

The pulling force on the first end may be present before, during, and after heating of the crucible. Thermal expansion of the crucible may decrease slightly the cable tension, thereby decreasing slightly the pulling force on the first end. Contraction of the crucible upon cooling may increase slightly the cable tension, thereby increasing slightly the pulling force on the first end. Thus, the magnitude of the pulling force may vary during the heating and cooling of the crucible. The initial tension of the cable prior to crucible heating ranges for example from about 10 to about 50 pounds, preferably from about 30 to about 40 pounds, and especially about 35 pounds.

By providing a pulling force on the first end in a direction parallel to the length of the crucible, the apparatus maintains the levelness of the crucible during its thermal expansion without exerting any upward or downward force on the first end of the crucible. In addition, the pulling force directed in such a manner avoids twisting (in a side to side manner) of the heated, expanding crucible since the pulling force encourages the crucible to expand in a straight manner. Thus, the inventive method and apparatus minimize or eliminate bowing and/or twisting of the heated crucible which if uncorrected can lead to the problems including coating defects described herein.

Other modifications of the present invention may occur to those skilled in the art based upon a reading of the present disclosure and these modifications are intended to be included within the scope of the present invention.

We claim:

1. A method for maintaining the levelness of a crucible having a first end and a second end during thermal expansion of the crucible comprising: securing the second end to minimize movement of the crucible; and providing a continuous pulling force on the first end in a direction parallel to the length of the crucible during heating of the crucible, wherein the pulling force is provided by a cable having an initial tension prior to crucible heating of from about 10 to about 50 pounds.

2. The method of claim 1, further comprising providing the continuous pulling force on the first end in the direction parallel to the length of the crucible prior to the heating of the crucible and subsequent to the termination of the heating where the crucible contracts.

3. The method of claim 2, wherein the continuous pulling force decreases during the thermal expansion of the crucible and increases during contraction of the crucible.

4. The method of claim 1, wherein the pulling force prior to crucible heating is adjustable.

5. The method of claim 1, wherein there is provided the pulling force along the entire first end of the crucible.

6. The method of claim 1, wherein the pulling force provided by the cable has the initial tension prior to crucible heating of from about 30 to about 40 pounds.

* * * * *